(12) United States Patent
Schlicker

(10) Patent No.: US 9,018,023 B2
(45) Date of Patent: Apr. 28, 2015

(54) DETECTION OF SURFACE DEFECTS BY OPTICAL INLINE METROLOGY DURING CU-CMP PROCESS

(75) Inventor: Mike Schlicker, Fraureuth (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 895 days.

(21) Appl. No.: 13/210,514

(22) Filed: Aug. 16, 2011

(65) Prior Publication Data

US 2013/0045546 A1   Feb. 21, 2013

(51) Int. Cl.
*H01L 21/00*   (2006.01)
*H01L 21/66*   (2006.01)

(52) U.S. Cl.
CPC .............. *H01L 22/26* (2013.01); *H01L 22/12* (2013.01)

(58) Field of Classification Search
CPC ...................... H01L 21/31053; H01L 21/3212
USPC .................................... 438/7, 8, 16, 692, 693
See application file for complete search history.

(56) References Cited

U.S. PATENT DOCUMENTS

| 6,424,137 | B1* | 7/2002 | Sampson ................... 324/76.21 |
| 6,821,794 | B2* | 11/2004 | Laursen et al. ................... 438/8 |
| 6,957,581 | B2* | 10/2005 | Gilgunn .......................... 73/587 |
| 2008/0242195 | A1* | 10/2008 | Heinrich et al. .................. 451/6 |
| 2009/0275264 | A1* | 11/2009 | Schlicker et al. ................. 451/5 |

* cited by examiner

*Primary Examiner* — Zandra Smith
*Assistant Examiner* — John M Parker
(74) *Attorney, Agent, or Firm* — Ditthavong & Steiner, P.C.

(57) ABSTRACT

An efficient method of detecting defects in metal patterns on the surface of wafers. Embodiments include forming a metal pattern on each of a plurality of wafers, polishing each wafer, and analyzing the surface of the metal pattern on each polished wafer for the presence of defects in the metal pattern by analyzing an optical across-wafer endpoint signal, generated at the endpoint of polishing. Embodiments include determining the location of defects in the metal pattern by determining the position of non-uniformities in the optical-across-wafer endpoint signal.

16 Claims, 6 Drawing Sheets

DETECTION OF SURFACE DEFECTS BY OPTICAL INLINE METROLOGY DURING CU-CMP PROCESS

TECHNICAL FIELD

The present disclosure relates to defect detection during chemical mechanical polishing (CMP) of metal. The present disclosure is particularly applicable to CMP of copper (Cu) patterns on semiconductor wafers.

BACKGROUND

In wafer fabricating processes, a damascene technique in combination with CMP has been employed for patterning Cu interconnect structures. After Cu lines are formed, the remaining metal on top of the patterns is removed using CMP, which is generally safe for the surface of metal patterns, interlevel dielectrics (ILD)/barrier interfaces, and barrier/metal interfaces. However, under certain conditions during the metal CMP process, for example, during drift over pad lifetime, the metal surface may be subjected to chemical activity that may result in defects negatively effecting the reliability of the Cu lines. Such defects include side-wall corrosion and voids in the metal surface, as well as Cu residue remaining on the surface. To find and discard defective wafers, and to prevent production of additional defective wafers, it is necessary to incorporate testing of the wafer surfaces, particularly Cu pattern surfaces, into the process. The standard defect-analysis scan tests only a small percentage of wafers, for example only a few wafers in every fifth or sixth lot are scanned (where a lot includes 25 wafers). This system is characterized by a high delay time for defect inspection feedback. Therefore, a large number of wafers may become defective before any defects are realized and the occurrence of defects in subsequently fabricated wafers may be prevented.

A need therefore exists for methodology enabling testing of every wafer, without additional processing time, and preventing production of further defective wafers.

SUMMARY

An aspect of the present disclosure is a method of detecting defects in Cu patterns during a Cu-CMP process, by analyzing an optical across-wafer signal and image of each polished wafer for non-uniformities.

Another aspect of the present disclosure is a method of detecting defects in Cu patterns during the Cu-CMP process, by analyzing an optical across-wafer signal and image of each polished wafer of a batch of wafers for non-uniformities.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a metal pattern on each of a plurality of wafers; polishing each wafer; and analyzing the surface of the metal pattern on each polished wafer for the presence of defects in the metal pattern.

Aspects of the present disclosure include forming a copper pattern for the metal pattern. Further aspects include for each wafer, determining the endpoint of polishing by: periodically measuring the reflectance of the wafer surface during polishing, and receiving an optical endpoint signal when the reflectance reaches a predetermined level. Other aspects include analyzing the surface of the metal pattern of each wafer for the presence of defects in the metal pattern by analyzing an optical across-wafer endpoint signal, generated at the endpoint of polishing. Another aspect includes determining the location of defects in the metal pattern by determining the position of non-uniformities in the optical across-wafer endpoint signal. Additional aspects include directing a light beam across the wafer surface, measuring the reflectance of the wafer surface along the radius of the wafer, with respect to the distance from the center of each wafer, and generating the optical across-wafer endpoint signal. Further aspects include forming an image of the surface of each wafer indicating the location of defects in the metal pattern. Other aspects include directing a laser beam, as the light beam, across the wafer surface. Another aspect includes detecting and determining the location of voids in the metal patterns. Additional aspects include detecting and determining the location of side-wall corrosion of the metal patterns. Further aspects include detecting and determining the location of copper residue on the metal patterns.

Another aspect of the present disclosure is a method including: forming a metal pattern on each wafer of a batch of wafers; polishing the surface of one wafer of the batch; receiving an across-wafer endpoint signal at the endpoint of polishing for the one wafer; analyzing the across-wafer endpoint signal for the polished wafer of the batch for the presence of defects in the metal patterns; and repeating the steps of polishing the surface, receiving an across-wafer endpoint signal, and analyzing the across-wafer endpoint signal for another wafer of the batch, if no defects are detected in the metal pattern of the one wafer.

Aspects include repeating the steps of polishing the surface of a wafer, receiving an across-wafer endpoint signal, and analyzing the across-wafer endpoint signal for each subsequent wafer of the batch until a defect is detected, and stopping polishing of the remaining wafers of the batch once a defect is detected. Further aspects include, for a batch including 20 to 30 wafers: if no defect is detected in the metal pattern of any wafer of the batch of wafers, forming a metal pattern on each wafer of another batch of wafers, and repeating the steps of polishing the surface of each wafer, receiving an across-wafer endpoint signal at the endpoint of polishing for the wafer, and analyzing the across-wafer endpoint signal for the polished wafer, for the presence of defects in the metal pattern until a defect is detected, and stopping polishing of the remaining wafers of the another batch once a defect is detected. Other aspects include analyzing the across-wafer endpoint signal for each polished wafer for the presence of defects, at a rate of greater than 25 wafers per hour. Another aspect includes analyzing the across-wafer endpoint signal for each polished wafer for the presence of defects at a rate of 25 to 45 wafers per hour. Additional aspects include forming a copper pattern on the surface of each wafer. Further aspects include detecting and determining the location of defects in the copper pattern, wherein the defects include voids, side-wall corrosion, and copper residue. Other aspects include determining the endpoint of polishing by: periodically measuring the reflectance of the wafer surface during polishing, and receiving an optical endpoint signal when the reflectance reaches a predetermined level; and generating the across-wafer endpoint signal by: directing a laser beam across the wafer surface, measuring the reflectance of the wafer surface along the radius of the wafer with respect to the distance from the center of each wafer, generating an optical across-wafer signal from the measured reflectance, and forming an image of the surface of the wafer indicating the location of defects in the metal pattern.

Another aspect of the present disclosure is a method including: forming a copper pattern on each wafer of a batch of wafers, the batch of wafers including from 20 to 30 wafers; for a wafer of the batch: polishing a surface of the wafer; determining the endpoint of polishing for each wafer of the batch by: periodically measuring the reflectance of the wafer surface during polishing and receiving an optical endpoint signal when the reflectance reaches a predetermined level; analyzing the surface of the copper pattern on the polished wafer, for the presence of defects in the copper pattern, the defects including voids, side-wall corrosion, and copper residue, at a rate of 25 to 45 wafers per hour, by: directing a laser beam across the wafer surface; measuring the reflectance of the wafer surface along the radius of the wafer with respect to the distance from the center of each wafer, generating an optical across-wafer signal, forming an image of the surface of each wafer indicating the location of defects in the copper pattern, and analyzing the optical across-wafer signal and the image of the surface of each wafer for non-uniformities in the copper pattern; repeating the steps of polishing, determining an endpoint, and analyzing the surface, for each additional wafer of the batch, one at a time, until a defect is detected; and stopping polishing of the remaining wafers of the batch.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limited defect inspection during CMP of Cu patterns on wafer surfaces, resulting in a delayed response to the occurrence of a defective wafer, attendant upon the current defect detection method. Defects are often an indication of a problem with the CMP tool. Further, defects in metal patterns can be critical to the reliability of wafers. Therefore, it is essential to detect defects as soon as they occur and address the source of defects to prevent their further occurrence. In accordance with embodiments of the present disclosure, As every wafer is analyzed for defects before the next wafer is processed, and data from the analysis is immediately available, a reaction to the cause of defects in the Cu patterns can be immediate, which would result in a wafer production having a very low defect rate. Additionally, the "catch-rate" of defective wafers is increased to the maximum.

Methodology in accordance with embodiments of the present disclosure includes forming a metal pattern on each of a plurality of wafers, polishing each wafer, and analyzing the surface of the metal pattern on each polished wafer for the presence of defects in the metal pattern.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
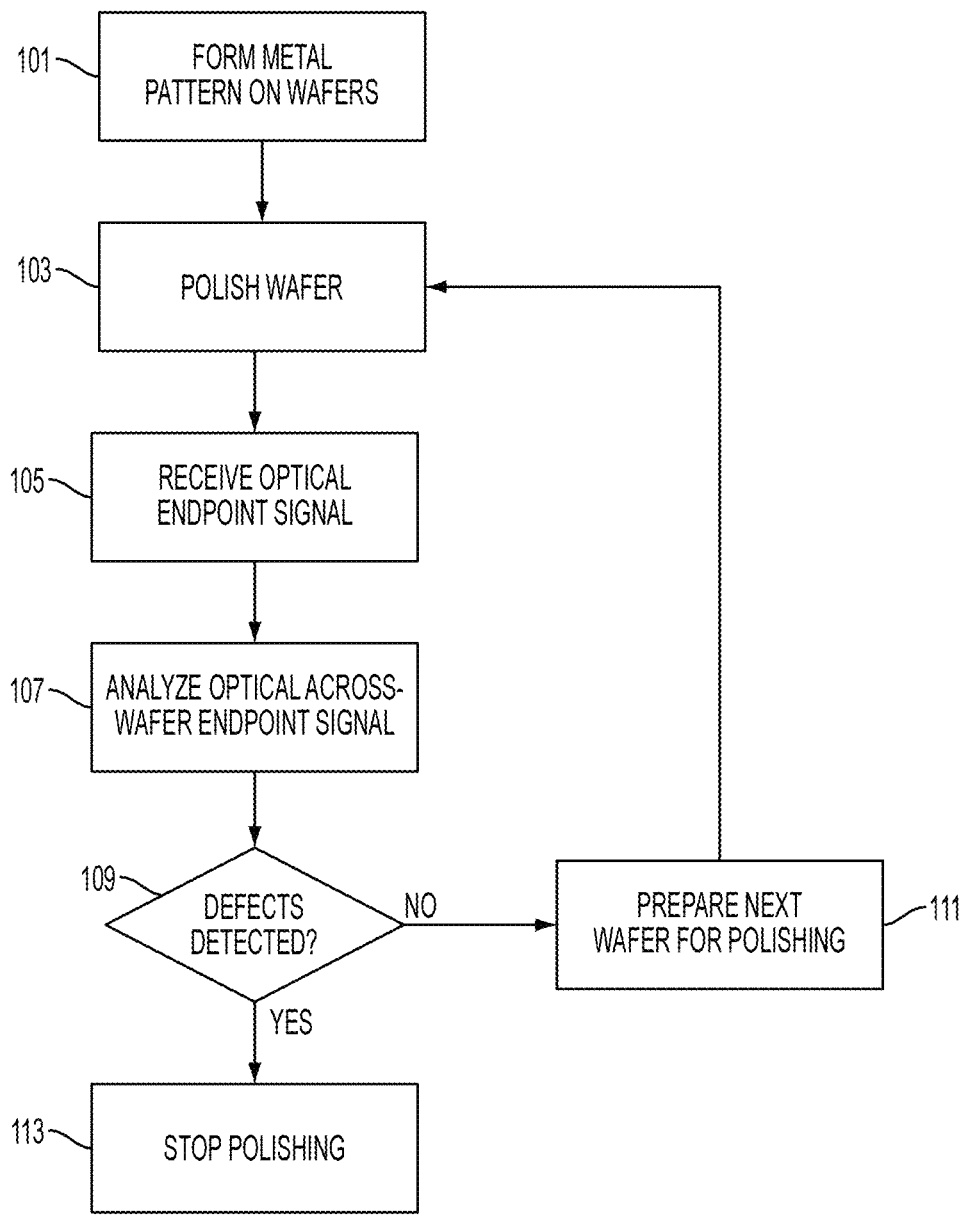
FIG. 1 shows a process flow in accordance with an exemplary embodiment.
Figure 2:
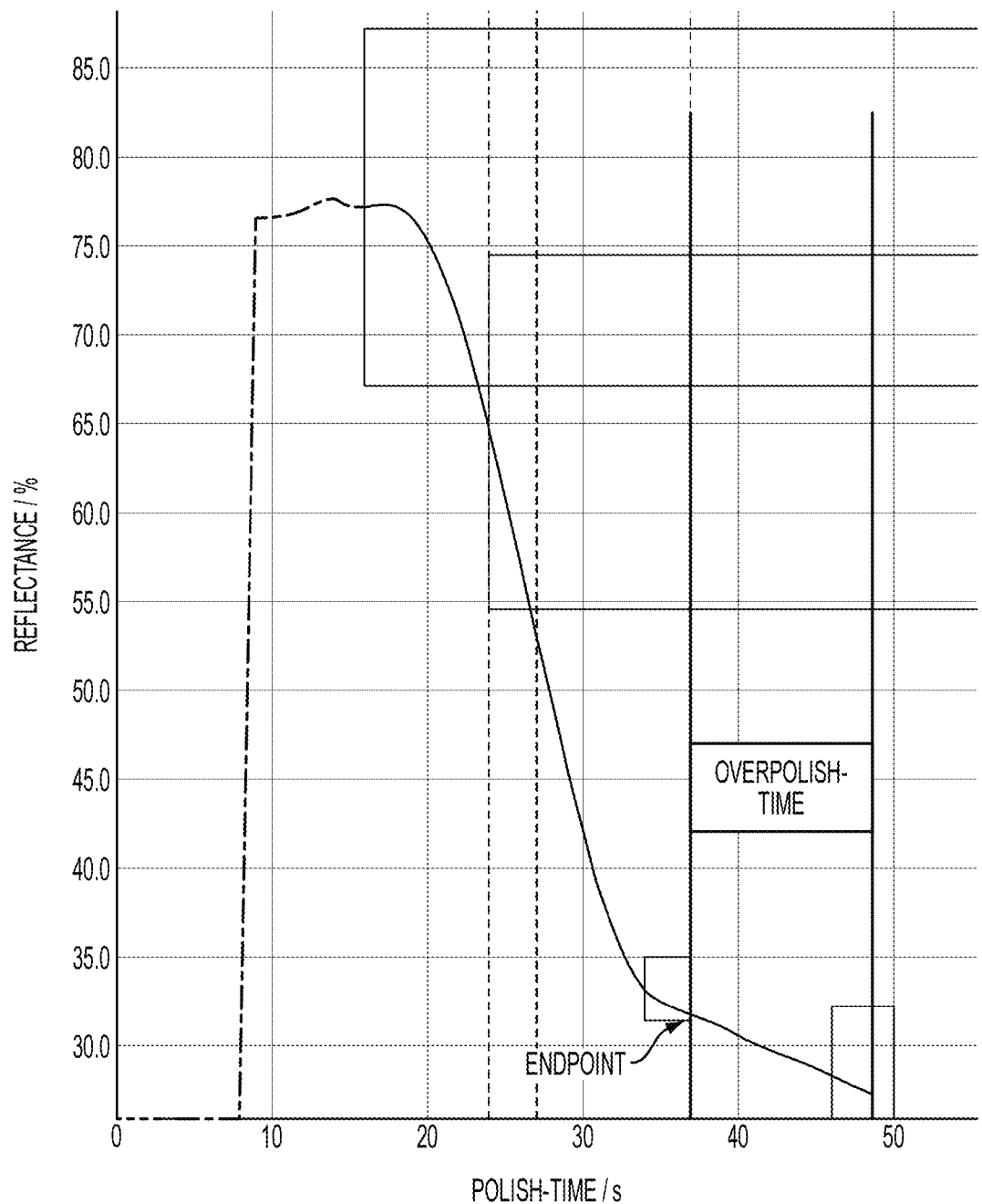
FIG. 2 illustrates an optical endpoint signal curve during the Cu-CMP process.

FIG. 1 shows a process flow in accordance with an exemplary embodiment. Adverting to FIG. 1, in the fabrication of wafers, metal patterns, for example Cu patterns, are formed on wafer surfaces for each wafer of a batch, as shown in step 101. For each wafer, the surface is polished to remove excess Cu and Cu residue (step 103) until a polishing endpoint is determined (step 105), and the wafer surface is analyzed for defects in the Cu patterns (step 107). If no defect is determined at step 109, the next wafer is prepared for polishing (step 111), and steps 101 through 109 are repeated. Once a defect is detected at step 109, polishing is stopped for all remaining wafers (step 113). The endpoint of polishing is determined using a conventional optical endpoint system, for example, a system that is integrated in the polish table, below the polished wafers. A beam of light is directed towards the surface, the optical endpoint system measures the reflectance of the wafer surface during the course of polishing, and once the predetermined reflectance percent value is reached, the system provides an optical endpoint signal to stop polishing. The predetermined reflectance corresponds to the optimal clearing of the wafer surface. FIG. 2 illustrates an example of an optical endpoint signal profile, wherein reflectance is measured periodically until it reaches about 32%, a value indicating an optimum polishing result. At that point, an optical endpoint signal is received (step 105), and polishing of the wafer is stopped.

Figure 3A:
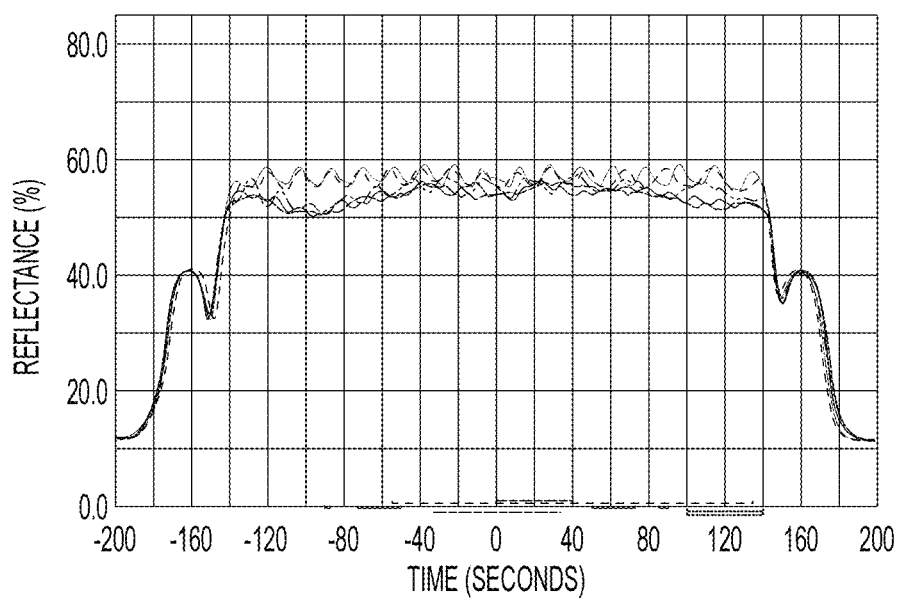
FIG. 3A illustrates an optical across-wafer endpoint signal profile of a wafer surface with Cu residue remaining after polishing.
Figure 3B:
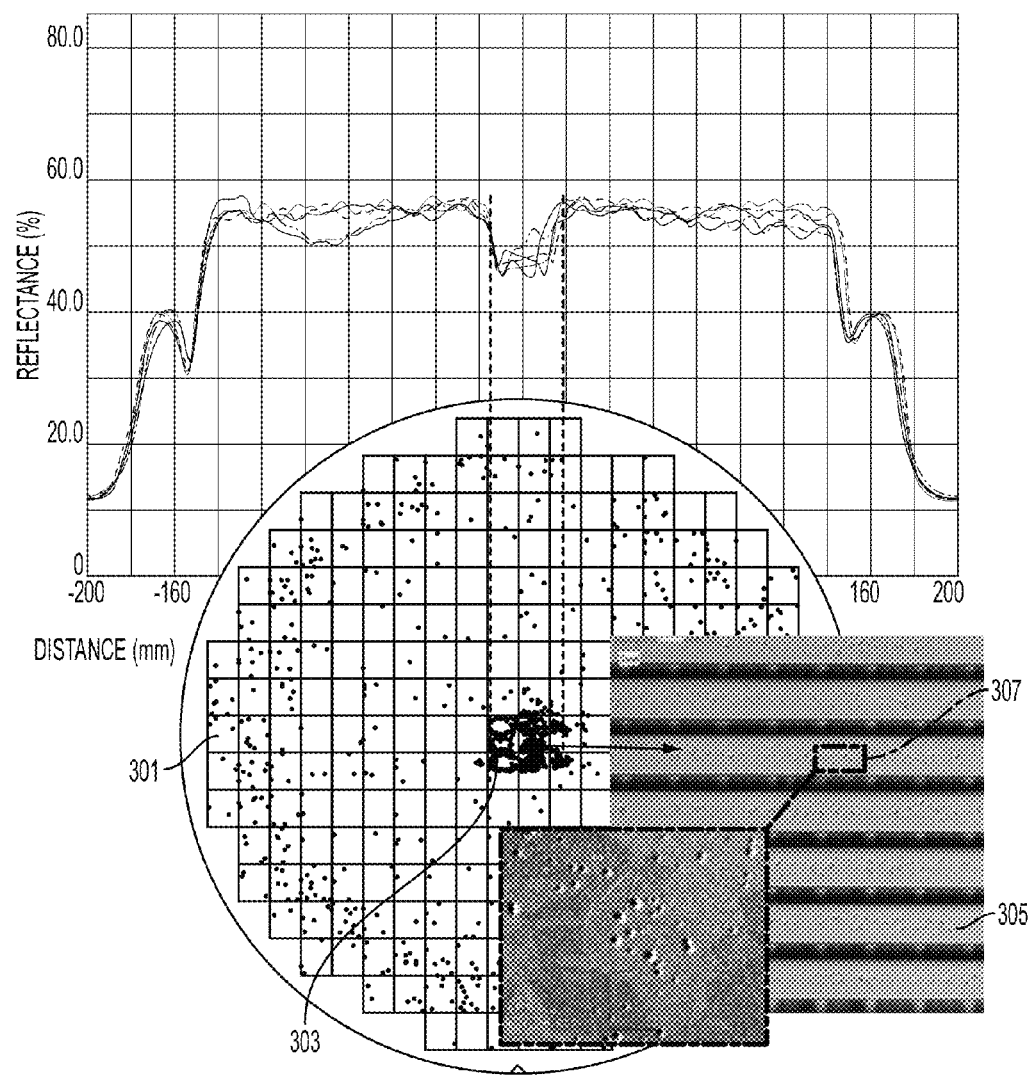
FIG. 3B schematically illustrates an optical across-wafer endpoint signal profile and a wafer map indicating voids in the Cu pattern, and a photograph of a fragment of a wafer surface showing a detail of the Cu pattern with voids.
Figure 3C:
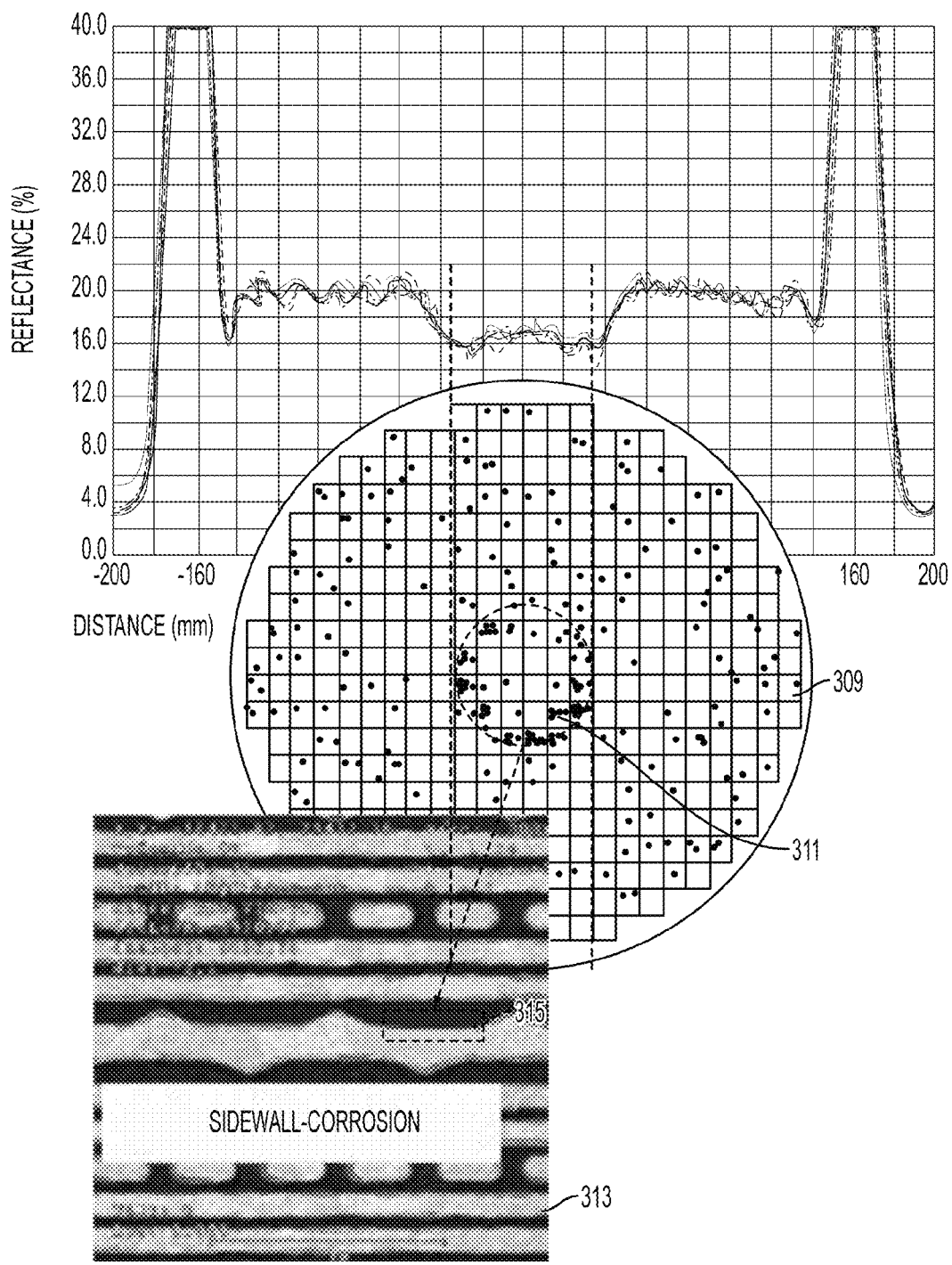
FIG. 3C schematically illustrates an optical across-wafer endpoint signal profile and a wafer map indicating side-wall corrosion in the Cu pattern, and a photograph of a fragment of a wafer surface showing a detail of the Cu pattern with side-wall corrosion.
Figure 3D:
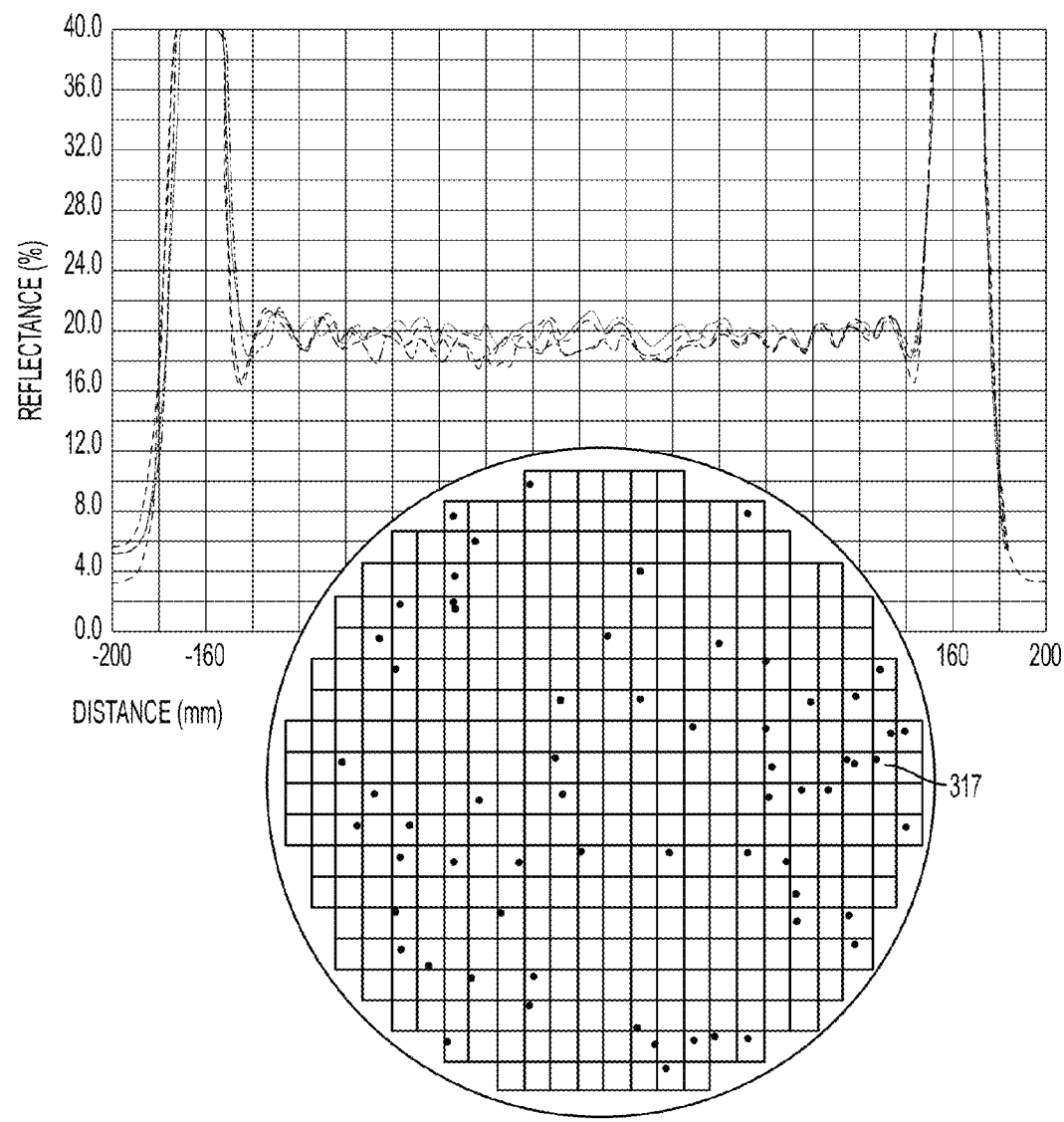
FIG. 3D schematically illustrates an optical across-wafer endpoint signal profile and a wafer map of a wafer not affected by defects.

In accordance with an exemplary embodiment, the optical endpoint system is also used in the analysis to detect and locate defects in the Cu patterns in the same wafer. Examples of defects that may have occurred during polishing include voids in the Cu surface and side-wall corrosion, as well as Cu residue remaining on the pattern surface. A light beam, for example, a laser beam, is directed at the wafer surface, the reflectance of the surface of the wafer along the radius of the wafer with respect to the distance from the center of the wafer is measured, and an optical across-wafer endpoint signal is generated at the endpoint of polishing. The optical across-wafer endpoint signal is analyzed for the presence and location of defects. FIG. 3A shows an across-wafer endpoint signal profile after polishing a wafer that has Cu residue remaining on the wafer surface. In FIG. 3A, reflectance is measured in percentages (%) along the radius of the wafer with respect to the distance in millimeters (mm) from the center of the wafer. FIG. 3B illustrates another exemplary profile of an across-wafer endpoint signal of a defective wafer surface. The signal profile corresponding to the area near the center of the wafer includes a non-uniformity, a drop in reflectance indicating a presence of a defect and its location. Following the across-wafer signal, an image 301 of the wafer surface is produced indicating with specificity area 303 where the defects, in this case voids in the Cu pattern surface, occur. Specific region 307 with visible voids is shown in photograph 305. An across-wafer endpoint signal profile for another kind of defect is illustrated in FIG. 3C. The signal curve shows non-uniformity in the area near the center of the wafer. Image 309 of the wafer surface indicates a cluster of defects 311, representing side-wall corrosion, shown in photograph 313 in area 315. In contrast with the profiles and images in FIGS. 3B and 3C, a uniform across-wafer endpoint signal profile is illustrated in FIG. 3D, and a corresponding wafer surface image 317 is shown on which no defects appear.

The cycle of polishing the surface of a wafer and analyzing the across-wafer signal for the presence of defects can be performed with respect to a batch of wafers, one wafer at a time, the batch of wafers including, for example, 20 to 30 wafers. If no defect is detected in the metal pattern, the next wafer in the batch is polished and analyzed for the presence of defects. If no defect is detected in a whole batch of wafers, the process may continue with another batch, polishing and analyzing each wafer for defects. If, however, a defective pattern is found the polishing of the remaining wafers of the batch is stopped and no wafers of a next batch are polished and analyzed for defects, so that the problem that caused the defect may be immediately addressed and production of additional defective wafers may be prevented. By this process, greater than 25 wafer, for example 25 to 45 wafers, may be processed and verified per hour.

The embodiments of the present disclosure can achieve several technical effects, including significantly reducing the number of defective wafers by enabling a quick response to the problem that caused the defects in metal patterns, ensuring that all of the polished wafers are checked for defects, and improving the efficiency of the quality control system. The present disclosure enjoys industrial applicability in any of various types of highly integrated semiconductor devices that include polished metal.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a metal pattern on each of a plurality of wafers;
polishing each wafer;
for each wafer, determining the endpoint of polishing by:
periodically measuring the reflectance of the wafer surface during polishing; and
receiving an optical across-wafer endpoint signal when the reflectance reaches a predetermined level;
analyzing the surface of the metal pattern on each polished wafer for the presence of defects in the metal pattern by analyzing the optical across-wafer endpoint signal, generated at the endpoint of polishing;
repeating the steps of polishing each wafer, determining the endpoint of polishing, and analyzing the surface of the metal pattern on each polished wafer for defects, for each subsequent wafer of the plurality of wafers until a defect is detected; and
stopping polishing of the remaining wafers of the plurality of wafers once a defect is detected.

2. The method according to claim 1, comprising determining the location of defects in the metal pattern by determining the position of non-uniformities in the optical across-wafer endpoint signal.

3. The method according to claim 2, further comprising directing a light beam at the wafer surface, measuring the reflectance of the wafer surface along the radius of the wafer, with respect to the distance from the center of each wafer, and generating the optical across-wafer endpoint signal.

4. The method according to claim 3, comprising forming an image of the surface of each wafer indicating the location of defects in the metal pattern.

5. The method according to claim 4, comprising directing a laser beam, as the light beam, at the wafer surface.

6. The method according to claim 5, comprising detecting and determining the location of voids in the metal patterns.

7. The method according to claim 5, comprising detecting and determining the location of side-wall corrosion of the metal patterns.

8. The method according to claim 5, further comprising forming a copper pattern for the metal pattern and detecting and determining the location of copper residue on the metal patterns.

9. A method comprising:
forming a metal pattern on each wafer of a batch of wafers;
polishing the surface of one wafer of the batch;
receiving an across-wafer endpoint signal at the endpoint of polishing for the one wafer;
analyzing the across-wafer endpoint signal for the polished wafer for the presence of defects in the metal pattern; and
repeating the steps of polishing the surface, receiving an across-wafer endpoint signal, and analyzing the across-wafer endpoint signal for another wafer of the batch, if no defects are detected in the metal pattern of the one wafer repeating the steps of polishing the surface of a wafer, receiving an across-wafer endpoint signal, and analyzing the across-wafer endpoint signal for each subsequent wafer of the batch until a defect is detected; and
stopping polishing of the remaining wafers of the batch once a defect is detected.

10. The method according to claim 9 wherein a batch includes from 20 to 30 wafers, the method further comprising:
   if no defect is detected in the metal pattern of any wafer of the batch of wafers, forming a metal pattern on each wafer of another batch of wafers;
   repeating the steps of polishing the surface of each wafer, receiving an across-wafer endpoint signal at the endpoint of polishing for the wafer, and analyzing the across-wafer endpoint signal for the polished wafer, for the presence of defects in the metal pattern until a defect is detected; and
   stopping polishing of the remaining wafers of the another batch once a defect is detected.

11. The method according to claim 9, comprising analyzing the across-wafer endpoint signal for each polished wafer for the presence of defects, at a rate of greater than 25 wafers per hour.

12. The method according to claim 11, comprising analyzing the across-wafer endpoint signal for each polished wafer for the presence of defects at a rate of 25 to 45 wafers per hour.

13. The method according to claim 9, comprising: forming a copper pattern on the surface of each wafer.

14. The method according to claim 13, comprising detecting and determining the location of defects in the copper pattern, wherein the defects include voids, side-wall corrosion, and copper residue.

15. The method according to claim 13, comprising:
   determining the endpoint of polishing by:
   periodically measuring the reflectance of the wafer surface during polishing and receiving an optical endpoint signal when the reflectance reaches a predetermined level;
   generating the across-wafer endpoint signal by:
   directing a laser beam across the wafer surface, measuring the reflectance of the wafer surface along the radius of the wafer with respect to the distance from the center of each wafer;
   generating an optical across-wafer signal from the measured reflectance; and
   forming an image of the surface of the wafer indicating the location of defects in the metal pattern.

16. A method comprising:
   forming a copper pattern on each wafer of a batch of wafers, the batch of wafers including from 20 to 30 wafers;
   for a wafer of the batch:
   polishing a surface of the wafer;
   determining the endpoint of polishing for each wafer of the batch by:
   periodically measuring the reflectance of the wafer surface during polishing and receiving an optical endpoint signal when the reflectance reaches a predetermined level;
   analyzing the surface of the copper pattern on the polished wafer, for the presence of defects in the copper pattern, the defects including voids, side-wall corrosion, and copper residue, at a rate of 25 to 45 wafers per hour, by:
   directing a laser beam across the wafer surface,
   measuring the reflectance of the wafer surface along the radius of the wafer with respect to the distance from the center of each wafer,
   generating an optical across-wafer signal,
   forming an image of the surface of each wafer indicating the location of defects in the copper pattern, and
   analyzing the optical across-wafer signal and the image of the surface of each wafer for non-uniformities in the copper pattern;
   repeating the steps of polishing, determining an endpoint, and analyzing the surface, for each additional wafer of the batch, one at a time, until a defect is detected; and
   stopping polishing of the remaining wafers of the batch.

* * * * *